United States Patent [19]
Park et al.

[11] Patent Number: 5,447,878
[45] Date of Patent: Sep. 5, 1995

[54] METHOD FOR MANUFACTURING A SEMICONDUCTOR MEMORY DEVICE HAVING A CAPACITOR WITH INCREASED EFFECTIVE AREA

[75] Inventors: Young-woo Park, Kyungi-do; Jun-yong No, Incheon; Sang-pil Sim, Suwon, all of Rep. of Korea

[73] Assignee: Samsung Electronics Co., Ltd., Suwon, Rep. of Korea

[21] Appl. No.: 112,331

[22] Filed: Aug. 27, 1993

[30] Foreign Application Priority Data

Sep. 19, 1992 [KR] Rep. of Korea .................. 92/17123

[51] Int. Cl.$^6$ .................. H01L 21/70; H01L 27/00
[52] U.S. Cl. .................. 437/52; 437/60; 437/919
[58] Field of Search .................. 437/52, 47, 60, 919; 148/DIG. 14, DIG. 138; 257/304, 305, 301

[56] References Cited

U.S. PATENT DOCUMENTS

| | | | |
|---|---|---|---|
| 5,134,086 | 7/1992 | Ahn | 437/52 |
| 5,256,587 | 10/1993 | Jun et al. | 437/52 |
| 5,324,679 | 6/1994 | Kim et al. | 437/52 |

*Primary Examiner*—Olik Chaudhuri
*Assistant Examiner*—H. Jey Tsai
*Attorney, Agent, or Firm*—Charles R. Donohoe; Robert A. Westerlund, Jr.; Stephen R. Whitt

[57] ABSTRACT

A storage electrode of a capacitor of a semiconductor memory device and a method for manufacturing the same are disclosed. A first electrode of the capacitor comprises a main electrode having a plurality of microtrenches and micropillars formed therein, an outer wall surrounding the microtrenches and micropillars, a granular silicon layer formed on an outer sidewall of the outer wall, and a column electrode supporting the main electrode and electrically connecting the main electrode to a source region of a transistor of the semiconductor device. The first electrode preferably has a horizontally fin-structured auxiliary electrode formed underneath the main electrode and electrically connected to the column electrode of the first electrode. The capacitor may be formed by using an etching end-point detection layer and an HSG polysilicon layer. The effective surface area of the storage electrode of a capacitor is increased to thereby obtain adequate cell capacitance. Also, uniform shapes of the storage electrodes are preferably obtained to thereby attain uniform cell capacitance.

13 Claims, 15 Drawing Sheets

METHOD FOR MANUFACTURING A SEMICONDUCTOR MEMORY DEVICE HAVING A CAPACITOR WITH INCREASED EFFECTIVE AREA

BACKGROUND OF THE INVENTION

The present invention relates to a semiconductor memory device having a capacitor, and a manufacturing method thereof, and more particularly, to a semiconductor memory device having a capacitor and manufacturing method thereof having a novel structure in which the surface area of a storage electrode of the capacitor is increased. The present invention is an improvement over the invention which is the subject matter of the applicant's pending U.S. patent application Ser. No. 07/937,749 filed on Sep. 1, 1992, the disclosure of which is hereby incorporated into this application by reference.

With the continuous development of fabrication technology for semiconductor devices and with the expansion of the applications for memory devices, the development of large-capacity memory devices is being carried out at a brisk pace. Particularly, a dynamic random access memory (DRAM) device, which consists of one memory cell and one capacitor and is thus well-suited to high integration, has been remarkably developed in terms of packing density.

The packing density of such a DRAM has been further integrated by a factor of four within a span of three years. At present, in the DRAM field, 4 Mb DRAMs are in mass production and 16 Mb DRAMs are soon to be produced in large quantities. Further, the 64 Mb DRAM and 256 Mb DRAM are being actively studied for mass production.

These semiconductor memory devices should have large capacitances for the reading out and storing of information. However, since the four-fold increase in integration results in only a 40% increase in the effective chip area, the area of the memory cell effectively decreases to one third its original size. This dictates that a conventional capacitor structure cannot realize a sufficiently large cell capacitance in the limited area. Therefore, in order to achieve larger capacitances in a smaller area, methods have been proposed which usually include decreasing the thickness of the dielectric film, using a material with a large dielectric constant as the dielectric material, and increasing the effective area of the capacitor's storage electrode.

If the thickness of the dielectric film is brought below 100 Å, the reliability of the semiconductor memory device is diminished due to the leakage current caused by Fowler-Nordheim tunnelling. Accordingly, reducing the dielectric film's thickness is not suitable for large-capacitance memory device.

Also, a high-dielectric material may be used for the dielectric film of the capacitor. $Ta_2O_5$, which has a good step coverage with respect to three-dimensional memory cell structures having large aspect ratios, is being widely studied. However, at present, applying a thin film of $Ta_2O_5$ in products results in high leakage current and a low breakdown voltage. To overcome this, various efforts to develop other materials with high dielectric constants are being pursued but, as yet, no practical methods for applying them in semiconductor memory devices have been reached.

Thus, in order to achieve large capacitances for the above-mentioned smaller cell area, the method which has been studied most actively is the increase of the effective storage area of the electrode. Growing from the conventional planar capacitor cell, three-dimensional structures such as a stacked capacitor cell and a trench capacitor cell have been introduced and are now being applied to 4 Mb DRAMs. However, this method exhibits limitation beyond 16 Mb DRAMs. In the stacked capacitor cell, due to the stacked capacitor structure, the step difference problem is serious, while in the trench capacitor cell, leakage current between trenches is created due to the scaling down. Accordingly, this method is difficult to apply in 64 Mb DRAMs.

Therefore, to solve the problem of large-capacitance DRAM cells, new capacitor structures such as the stacked trench capacitor, fin-structured capacitor, box-structured capacitor and spread-stacked capacitor are being considered. However, attempts to increase capacitance by improving storage electrode structure are limited in the development of next-generation devices having higher integration due to design rule limitations and complicated processing. This requires the development of a new capacitor structure which overcomes such problems.

To meet such a requirement, a method has recently been suggested in which increasing a capacitor's capacitance does not depend upon the structural improvement of a storage electrode, but upon an uneven topography of the surface of the storage electrode so that the effective capacitance area of the storage electrode is thus increased.

For instance, a paper entitled "Capacitance-Enhanced Stacker-Capacitor with Engraved Storage Electrode for Deep Submicron DRAMs" (by T. Mine et al., Extended Abstract of the 21st conference on Solid State Devices and Materials. Tokyo, 1989, pp. 137-140) discloses a method in which a mixture of SOG (spin-on-glass) and resist is formed on a polycrystalline silicon (hereinafter referred to as "polysilicon") layer. In this method, the SOG is selectively removed using a buffered HF solution to leave resist particles on the polysilicon layer, and the polysilicon layer is then etched using the resist particles to make the surface of the polysilicon layer topographically uneven.

U.S. Pat. No. 5,068,199 by Sandu discloses a method in which the storage electrode of a capacitor is formed using a porous polysilicon conductive layer to make the surface of the storage electrode uneven using an anodization.

U.S. Pat. No. 5,112,773 by Tuttle discloses a method in which a material for creating a heterogenous nucleation is implanted, or the deposition temperature or pressure is increased, to create uniform nucleation in the silicon source itself so that the polysilicon is deposited using vapor nucleation, to thus make the polysilicon layer uneven.

Further, another method has been suggested for forming an uneven polysilicon layer by adjusting the deposition condition of the polysilicon layer. Papers entitled "A New Stacked Capacitor Structure Using Hemispherical-Grain (HSG) Polysilicon Electrodes" (by H. Watanabe et al., SSDM, 1990, pp. 873-876) and "Fabrication of Storage Capacitance-Enhanced Capacitor with a Rough Electrode" (by Yoshio Hayashide et al., SSDM, 1990, pp. 869-872) disclose techniques in which a polysilicon layer having an uneven surface is formed at a predetermined temperature and under a predetermined pressure, and a storage electrode is formed using the polysilicon layer so that the surface of the storage electrode is increased due to the uneven surface of the polysilicon layer, thereby increasing the cell capacitance. Specifically, when the polysilicon layer to be used as the storage electrode is deposited at 550° C. (which is the phase transition temperature in which amorphous silicon changes to a polysilicon) using low pressure chemical vapor deposition (LPCVD), the surface of the obtained polysilicon layer has hemispherical grains (hereinafter referred to as an "HSG polysilicon layer"), which approximately doubles the surface area. Hayashide et al. teach that when the storage electrode is formed by depositing the polysilicon at 575° C., the capacitance increases to about one and a half times that of conventional polysilicon electrodes. Furthermore, Japanese Patent Laid-Open Publication No. Hei 1-42161 discloses a method in which the polysilicon layer formed according to the above method is used to form a storage electrode.

However, when employing the methods for making the storage electrode uneven using HSG polysilicon layer or other methods, though the surface of the polysilicon layer is approximately doubled, the effective area of a storage electrode for obtaining the cell capacitance required in very large scale integration (VLSI) semiconductor memory devices (above 256 Mb) still cannot be obtained.

Therefore, in order to solve such problems, Chin et al. (including one of the present inventors) invented a manufacturing method for a semiconductor memory device comprising a newly structured storage electrode required for VLSI semiconductor memory devices, and have filed the invention as U.S. patent application Ser. No. 07/937,749.

FIGS. 1, 2 and 3 are schematic views for explaining the method disclosed in the above patent application and show a storage electrode, dielectric layer and plate electrode only, which are the components of a capacitor of a semiconductor memory device. When this capacitor is applied in an actual memory cell, it is obvious to one skilled in the art that the storage electrode should be connected to the source region of a transistor which is a switching device. Therefore, the description and depiction of the preceding step in which the storage electrode and source region are connected, will be omitted.

FIG. 1 shows a step of forming a mask layer 11. Referring to FIG. 1, in order to form a storage electrode, an oxide is deposited on a conductive layer 10 having an uneven surface made of polysilicon hemispherical protrusions to form a mask layer 11 which is thicker than the depth d of valleys 15 between the hemispherical protrusions, such that the valleys are buried underneath the mask layer 11. Here, though not shown in the figure, a transistor as a switching device is formed under conductive layer 10 which is connected to the source region of the transistor.

FIG. 2 shows a step of forming an etching mask 11' by etching back mask layer 11. After forming mask layer 11, mask layer 11 is etched back until the upper surface of the hemispherical protrusions of the polysilicon is exposed so that the oxide which forms mask layer 11 is left in valleys 15 to thereby form etching mask 11'.

FIG. 3 illustrates a step of forming a capacitor by etching conductive layer 10 using etching mask 11'. More particularly, when conductive layer 10 is etched to a predetermined depth using etching mask 11' formed in valleys 15 of depth using etching mask 11' formed in valleys 15 of conductive layer 10, as shown in the figure, storage electrode 10' in the form of microtrenches and/or micropillars is formed. Dielectric layer 12 and plate electrode 13 are formed on storage electrode 10' to complete the capacitor.

FIGS. 4–9 sequentially illustrate an embodiment of a method for manufacturing the semiconductor memory device described in the above-noted U.S. patent application.

FIG. 4 shows a step of forming a transistor, planarization layer 20, first insulating layer 21 and second insulating layer 22. More particularly, a field oxide layer 42 for defining an active region and an isolation region is formed on semiconductor substrate 40 having a first conductivity. Source region 44 and drain region 46 are formed in the active region of semiconductor substrate 40 by a conventional process. Gate electrode 48 and word line 48' are formed on the active region and field oxide layer 42, respectively, to complete the transistor. Thereafter, planarization layer 20 is formed by depositing an insulating material, for instance, boro-phosphorus silicate glass (BPSG) or an oxide on the whole surface of the transistor structure and then planarizing it. First insulating layer 21, (for instance, a nitride layer having a thickness of about 500 Å–1,000 Å), and second insulating layer 22, (for instance, an oxide layer having a thickness of about 1,000 Å–2,000 Å), are formed sequentially on planarization layer 20. Here, reference number 49 indicates an insulating layer for insulating gate electrode 48 and word line 48'. The nitride layer of the insulating layer 21 will be used as an etching stop layer in the succeeding step.

A photoresist is coated on second insulating layer 22 to form a photoresist layer (not shown) which is then exposed using a mask. The exposed photoresist layer is developed to form a photoresist pattern. Using the photoresist pattern, the second insulating layer 22, first insulating layer 21, and first insulating interlayer 20 are etched to form first contact hole CH1 for connecting the storage electrode used for the first electrode of the capacitor to source region 44 of the transistor. Subsequently, the photoresist pattern for forming the first contact hole is removed and then polysilicon having hemispheric grains doped with an impurity is deposited to a thickness of 2,000 Å–6,000 Å on the whole surface of the resultant, to thereby form first conductive layer 24. Here, the surface of the conductive layer has a texture in which the grains are kept in close contact. However, it does not matter if the grains are somewhat separated from one another.

FIG. 6 shows a step of forming a first conductive layer pattern 24' and third insulating layer 26.

A photoresist is coated on first conductive layer 24 to form a photoresist layer. Using a photomask, the photoresist layer is exposed and the exposed portion thereof is developed to form a predetermined photoresist pattern (not shown). Using this photoresist pattern as an etching mask, first conductive layer 24 is etched to form first conductive layer pattern 24' as depicted. Subsequently, the photoresist pattern is removed and a high temperature oxide (HTO) is deposited to a thickness of, for instance, 300 Å–1,000 Å, on the overall resultant structure to form third insulating layer 26.

FIG. 7 illustrates a step of etching the third insulating layer. After the step shown in FIG. 6, the overall resultant structure is etched back until the tops of grains of the polysilicon constituting first conductive layer pattern 24' are exposed to form an etching mask 26' made of the HTO in the valleys between grains of the polysilicon constituting first conductive layer pattern 24'. Here, spacers 26a made of the HTO are formed on the sidewalls of conductive layer pattern 24'.

FIG. 8 shows a step of forming a storage electrode SE. First conductive layer pattern 24' is etched to form storage electrode SE using etching mask 26' formed in the valleys between the hemispherical polysilicon grains constituting first conductive layer pattern 24' and spacers 26a formed on the sidewalls of first conductive layer pattern 24'. Particularly, first conductive layer 24' under the etching mask 26' is not etched, and microtrenches MT are formed in the portion where the etching mask is not formed so as to, as shown in the figure, form storage electrodes SE made of a pattern including microtrenches MT or micropillars MP. Here, the etching of the first conductive layer pattern 24' is performed with a mixed gas of HBr and $Cl_2$ which has a high etching selectivity ratio with respect to the HTO used as the etching mask.

FIG. 9 shows a step of forming a capacitor C. After the step shown in FIG. 8, buffered oxide etchant (BOE) or diluted HF solution is used to remove etching mask 26' and spacers 26a made of the HTO, and a dielectric layer 30, (for instance, an ONO layer having an oxide/nitride/oxide structure or a NO layer having a nitride/oxide structure) is coated on the surface of the exposed storage electrode. Sequentially, polysilicon doped with an impurity is deposited on dielectric layer 30 and patterned to form a plate electrode PE. As a result, the capacitor comprised of storage electrode SE, dielectric layer 30 and plate electrode PE is completed. Subsequently, the drain region is exposed to form a bit line (not shown). Here, the bit line may be formed before the formation of the first conductive layer for forming the storage electrode.

In the storage electrode forming method disclosed in the above-described U.S. patent application, a timed etching (in which the etching step is performed for a predetermined time) is used for the step of forming an etching mask for forming the microtrenches. However, due to the variation of the thickness of the mask layer (reference numerals 11 and 26 in FIG. 1 and in FIG. 6, respectively) used as the etching mask and the variation of the etching rate according to etching equipment, it is difficult to form an etching mask (reference numeral 11' of FIG. 2 and reference numeral 26' of FIG. 7) to form microtrenches having a predetermined uniform thickness. Furthermore, cell capacitance is limited because the surface of the storage electrode is increased only by as much as the formation of microtrenches and/or micropillars.

SUMMARY OF THE INVENTION

Therefore, it is an object of the present invention to provide a semiconductor device with a capacitor which has a capacitance larger than that previously obtainable.

It is another object of the present invention to provide a method for manufacturing a semiconductor device with a capacitor which is especially suitable for fabricating the capacitor having the above-mentioned improved structure.

It is still another object of the present invention to provide a method for manufacturing a capacitor of a semiconductor memory device having microtrenches and micropillars having a uniform capacitance by using an etching mask having a uniform thickness by means of an etching end-point detecting layer.

In order to accomplish the first object of the present invention noted above, a semiconductor memory device having a capacitor is provided, comprising: a first electrode comprised of a main electrode having a plurality of microtrenches and micropillars formed therein and an outer wall surrounding the microtrenches and micropillars, a granular polysilicon pattern, typically having fine hemispherical grains, formed on an outer peripheral sidewall of the outer wall, and a column electrode supporting the main electrode which electrically connects the main electrode to a source region of a transistor; a dielectric film covering the first electrode; and a second electrode formed on the dielectric film. The capacitor may further comprise an auxiliary electrode formed under the main electrode and electrically connected to the column electrode.

In accordance with another aspect of the present invention, a semiconductor memory device having a capacitor is provided comprising: a first electrode comprised of a main electrode having a plurality of microtrenches and micropillars formed therein and an outer wall surrounding the microtrenches and micropillars, a column electrode supporting the main electrode and electrically connecting the main electrode to a source region of a transistor, and an auxiliary electrode formed under the main electrode and electrically connected to the column electrode; a dielectric film covering the first electrode; and a second electrode formed on the dielectric film.

In order to accomplish the other objects of the present invention noted above, a method for manufacturing a semiconductor memory device is provided, comprising the steps of: forming an end-of-etch detection layer on a semiconductor substrate; forming a conductive structure, having an uneven upper surface having a plurality of valleys, defined into individual cell units on the end-of-etch detection layer, such that the conductive structure leaves a portion of the end-of-etch detection layer around the conductive structure exposed; depositing a mask layer having an uniform thickness on the conductive structure and on the exposed portion of the end-of-etch detection layer; etching back the mask layer by detecting an endpoint of the etching using the end-of-etch detection layer, thereby forming an etching mask which has uniform thickness in the valleys; and partially etching the conductive structure using the etching mask to form a main electrode of a capacitor having microtrenches and micro pillars therein. Preferably, the conductive structure has a hummock on an upper peripheral edge of each cell unit.

It is also preferable that, prior to forming the end-of-etch detection layer, a first spacer layer is formed on the semiconductor substrate, and a second spacer layer is formed on the end-of-etch detection layer prior to the step of forming the conductive structure. The spacer layers are for isolating the end-of-etch detection layer from the lower structure and the upper structure. The end-of-etch detection layer may be comprised of a conductive material. By forming the end-of-etch detection layer and the conductive layer using the same conductive material, during etching the conductive structure, the end-of-etch detection layer is defined into an individual cell unit to form an auxiliary electrode under the main electrode.

However, it does not matter whether the end-of-etch detection layer is comprised of an insulating material so long as the insulating material has a different etching rate than the materials of the second spacer layer and the mask material layer.

The present invention also provides a method for manufacturing a semiconductor device comprising steps of: forming a conductive structure on a semiconductor substrate; forming an HSG polysilicon layer with fine hemispherical grains covering the conductive structure; and etching back the HSG polysilicon layer to leave a HSG polysilicon pattern on a sidewall of the conductive structure.

According to another aspect of the present invention, there is provided a method for manufacturing a semiconductor device comprising steps of: sequentially forming a first conductive layer and a first material layer on a semiconductor substrate; patterning the first material layer to form a first material layer pattern defined into individual cell units; partially etching the first conductive layer using the first material pattern as an etching mask to thereby form a first conductive layer pattern having a groove between adjacent cell units; forming spacers on sidewalls of the groove; and etching the first conductive layer pattern using the spacers and the first material pattern as an etching mask to form a first conductive pattern defined into individual cell units and having a hummock on an upper edge thereof. The first conductive pattern preferably has an uneven surface having a plurality of valleys. After forming the first conductive pattern, the spacer and the first material layer pattern are removed, then a mask material is deposited to form a mask layer on the surface of the resultant structure. The mask layer is etched back to form an etching mask, comprised of the mask material, in the valleys. Then, the first conductive pattern is partially etched using the etching mask to thereby form a main electrode of a capacitor having microtrenches and micropillars therein.

Providing an HSG polysilicon pattern on the sidewall of a conductive structure or an auxiliary electrode further increases the surface area of the storage electrode of a capacitor. The auxiliary electrode is preferably fin-shaped. Also, by using an etching end-point layer, an etching mask having a uniform thickness for forming microtrenches and micropillars can be formed in the valleys of an uneven conductive layer pattern. Thus, a regular shape of the storage electrodes may be obtained to thereby obtain uniform cell capacitance.

BRIEF DESCRIPTION OF THE DRAWINGS

The above objects and other advantages of the present invention will become more apparent by describing a preferred embodiment in detail with reference to the attached drawings in which.

DESCRIPTION OF THE PREFERRED EMBODIMENT

Embodiment 1

FIGS. 10–16 are cross-sectional views for explaining the first embodiment of a method for manufacturing a capacitor of a semiconductor memory device of the present invention.

In order to solve the problem of nonuniform cell capacitance according to timed etching disclosed in the patent application by Chin et al., this embodiment shows a method for manufacturing a capacitor using an end-of-etch detection layer.

Figure 1:
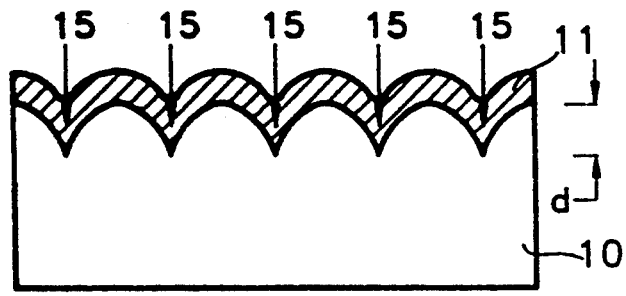
FIGS. 1, 2 and 3 are cross-sectional views for explaining a method of forming the storage electrode disclosed in U.S. patent application Ser. No. 07/937,749.
Figure 2:
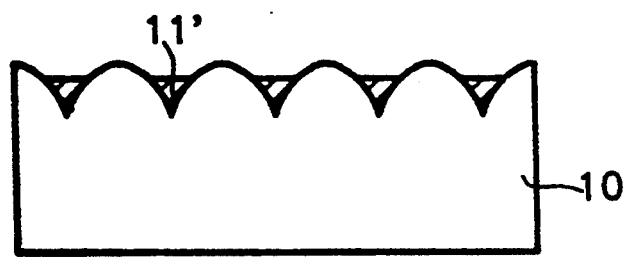
Figure 3:
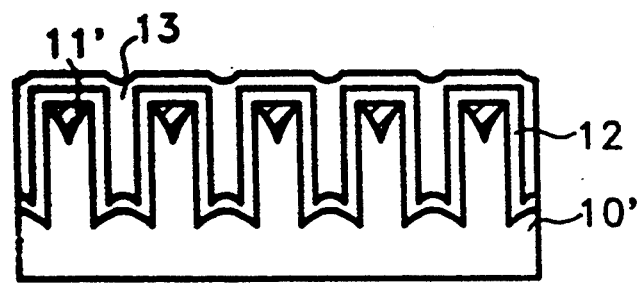
Figure 4:
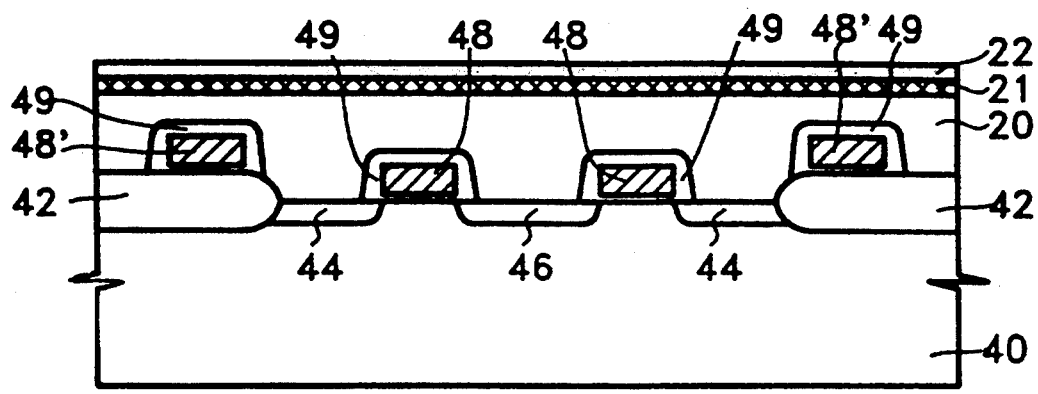
FIGS. 4–9 are cross-sectional views for explaining an embodiment of a method for manufacturing a capacitor of a semiconductor memory device disclosed in U.S. patent application Ser. No. 07/937,749.
Figure 5:
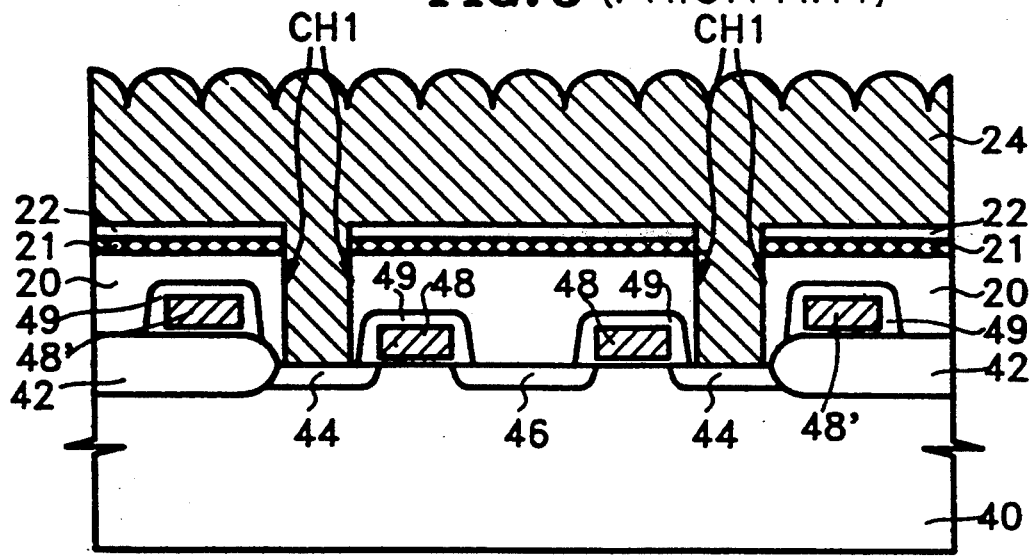
Figure 6:
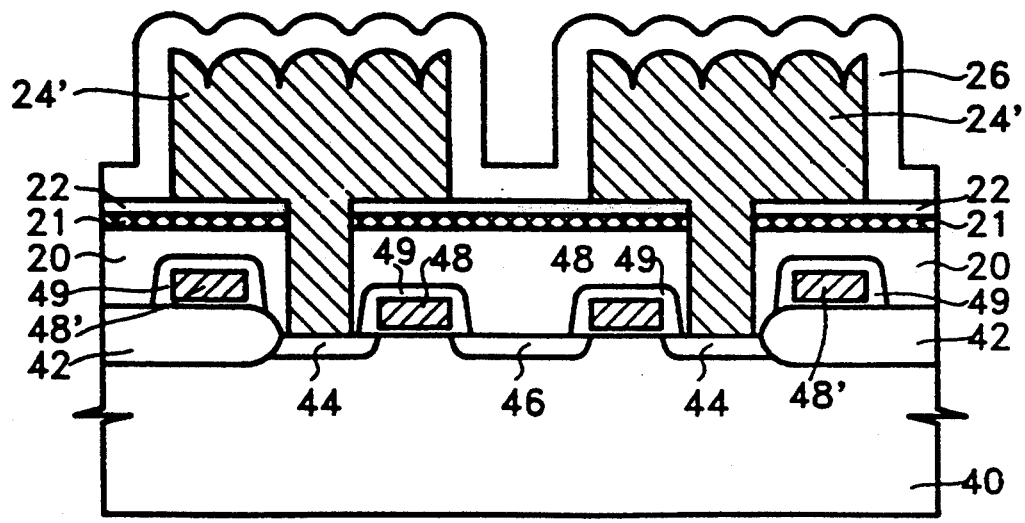
Figure 7:
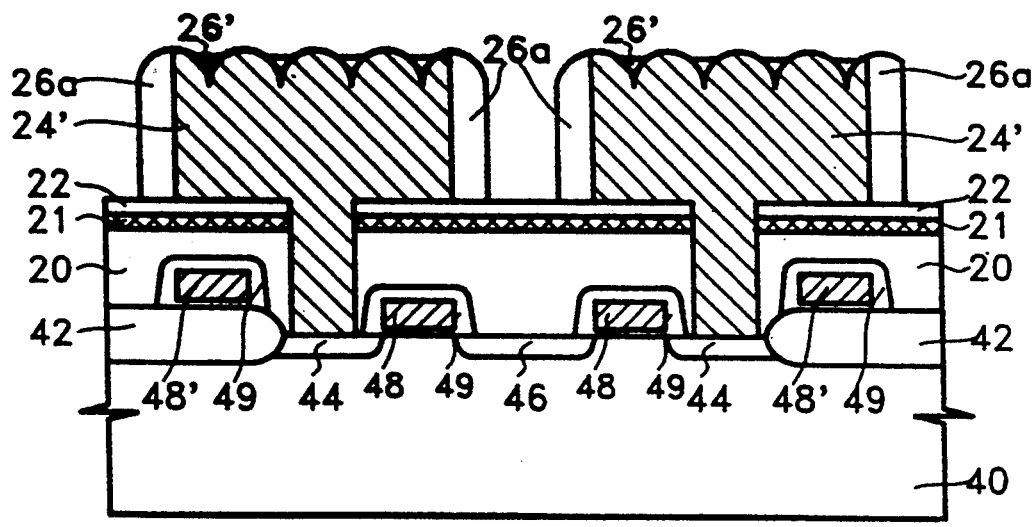
Figure 8:
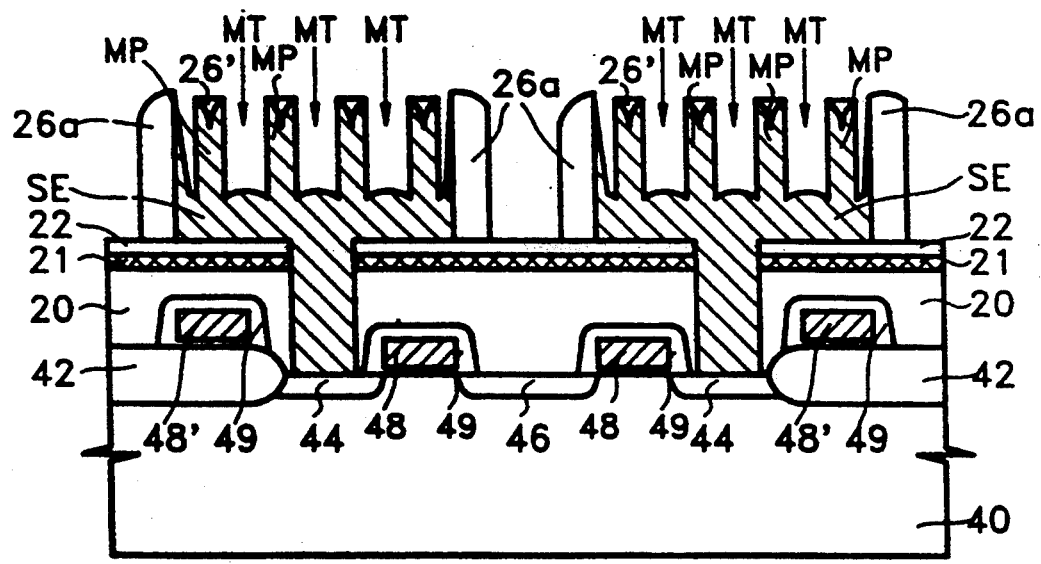
Figure 9:
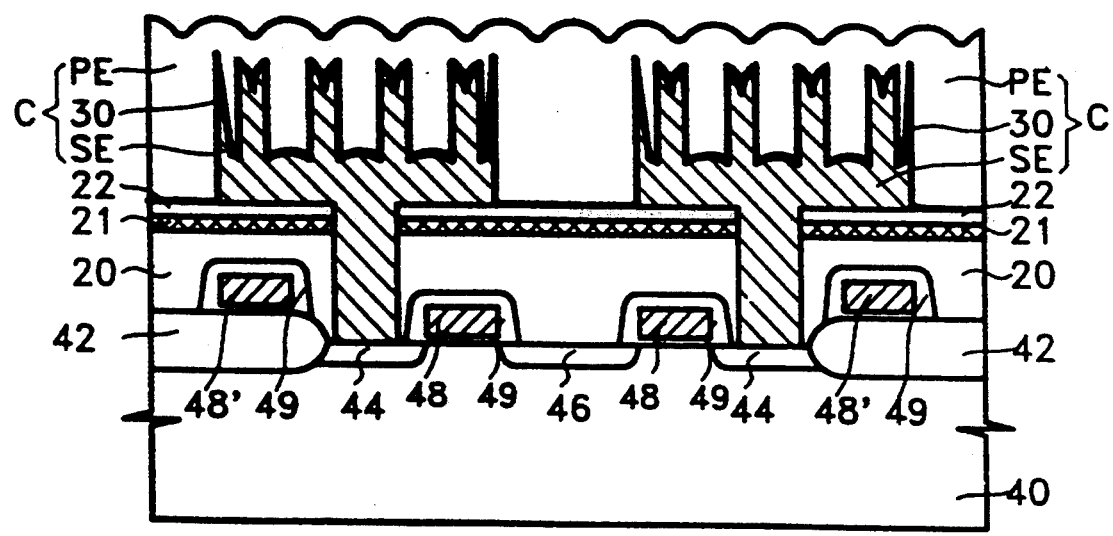
Figure 10:
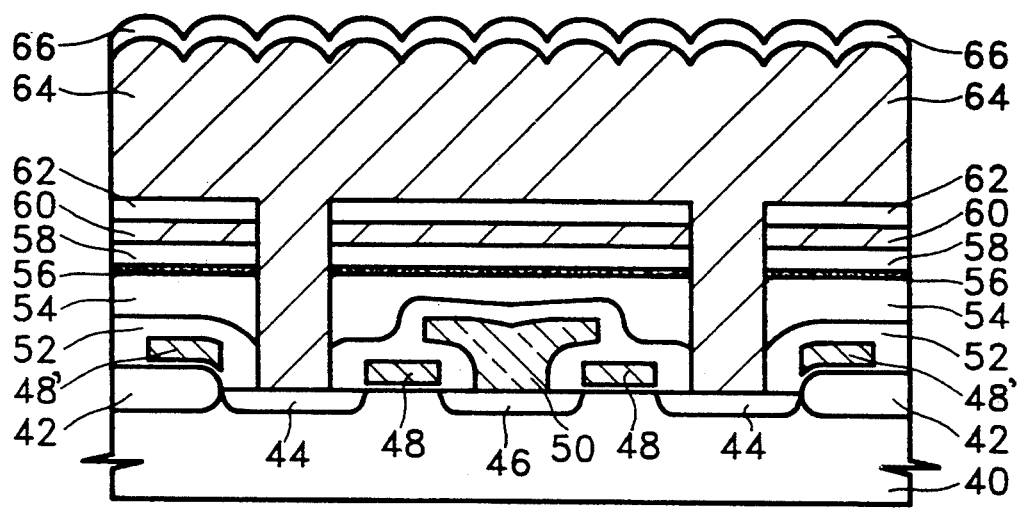
FIGS. 10–16 are cross-sectional views for explaining the first embodiment of a method for manufacturing a semiconductor memory device of the present invention.

FIG. 10 shows a step of forming an etch-blocking layer 56, first spacer layer 58, end-of-etch detection layer 60, second spacer layer 62, first conductive layer 64 and first material layer 66. More particularly, a field oxide layer 42 is formed on a semiconductor substrate 40 to define semiconductor substrate 40 into active regions and isolation regions. A transistor comprising a source region 44, drain region 46 and gate electrode 48 is formed on each active region. A bit line 50 in contact with the drain region of the transistor is formed and an insulating layer 52 for insulating the transistor from other conductive layers (formed in a subsequent process) is formed on the overall resultant structure. An insulating material layer having a reflow characteristic such as borophosphorous silicate glass (BPSG) is formed, reflowed by heat treatment, and planarized to form a planarization layer 54 having a planar surface.

Next, a material having a different etching rate from the material of the planarization layer 54 with respect to a predetermined etching process (assuming the etching rate of the material A as 1, the etching rate of the material B should be over about 4), (for instance, silicon nitride) is coated to a thickness of about 300 Å–500 Å to form etch-blocking layer 56.

A material having a different etching rate from the material constituting etch-blocking layer 56 with respect to a predetermined etching process, (for instance, an insulating material such as HTO), is coated to a thickness of about 500 Å–1,000 Å to form first spacer layer 58.

A material having a different etching rate from the material of first spacer layer 58 with respect to a predetermined etching process, (for instance, a silicon nitride insulating material or a conductive material such as polysilicon doped with impurity (preferably, the latter)), is coated to a thickness of about 500 Å–1,000 Å to form end-of-etch detection layer 60.

A material having a different etching rate from the material of end-of-etch detection layer 60 with respect to a predetermined etching process, (for instance, an insulating material such as HTO), is coated to a thickness of about 500 Å–1,000 Å to form second spacer layer 62.

First and second spacer layers 58 and 62 are formed in order to isolate end-of-etch detection layer 60 from the lower structure (that is, etch-blocking layer 56) and the upper structure (for example, first conductive layer 64 which is to be formed in a subsequent step).

The materials stacked on source region 44 are then partially removed to form a contact hole for connecting the storage electrode with the source region.

Next, a conductive material such as polysilicon doped with impurity is deposited to a thickness of about 2,000 Å–5,000 Å on the resultant structure, typically under 1 bar of pressure at 550° C. using silane gas (20-SiH$_4$) diluted with helium according to LPCVD, and a polysilicon layer having hemispherical grains is coated to a thickness of about 100 Å–2,500 Å. Thereafter, 3E15 ions/cm$_2$ of As is doped at 40 KeV–100 KeV of ion implantation energy to form first conductive layer 64 having an uneven uppermost surface with a plurality of valleys. Alternatively, an approximately 1,000 Å-thick polysilicon layer is first formed, then a 1,500 Å-thick polysilicon layer having hemispherical grains is deposited on the polysilicon layer. An impurity is then doped thereinto, to thus form first conductive layer 64. In yet another method, using the source of the polysilicon containing an impurity, the impurity-doped polysilicon itself is deposited to form first conductive layer 64. Also, first conductive layer 64 may be formed according to the aforedescribed conventional method.

Here, when the polysilicon having hemispherical grains is formed, it is preferable that the size (diameter) of the grains be about 700 Å–1,500 Å. Thereafter, a material having a different etching rate from the material of first conductive layer 64 with respect to a predetermined etching process, (for instance, an insulating material such as HTO), is coated to a thickness of about 500 Å to form first material layer 66.

Figure 11:
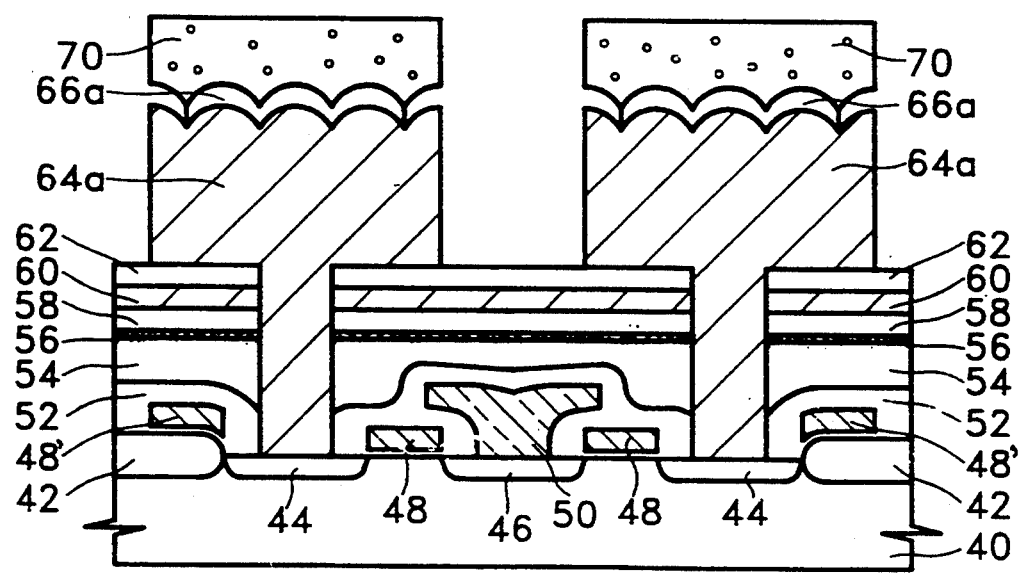

FIG. 11 shows a step of forming a first material pattern 66a for forming 1st first conductive pattern 64a and hummocks. According to a conventional method, a photoresist pattern 70 defined into individual cell units, is formed on first material layer 66. Anisotropic etching is carried out using photoresist pattern 70 as an etching mask until the surface of second spacer layer 62 is exposed, to sequentially etch first material layer 66 and first conductive layer 64 to form an interim first material layer pattern (not shown) and a first conductive pattern 64a. Here, first conductive layer 64 becomes first conductive pattern 64a which is defined into an individual cell units. Next, using an oxide etchant such as a BOE or HF solution diluted at a ratio of 100:1, the first material layer pattern (not shown) formed in the above step is partially etched further to form a first material pattern 66a (shown in FIG. 11) for making hummocks which has a size smaller than first conductive pattern 64a.

Figure 12:
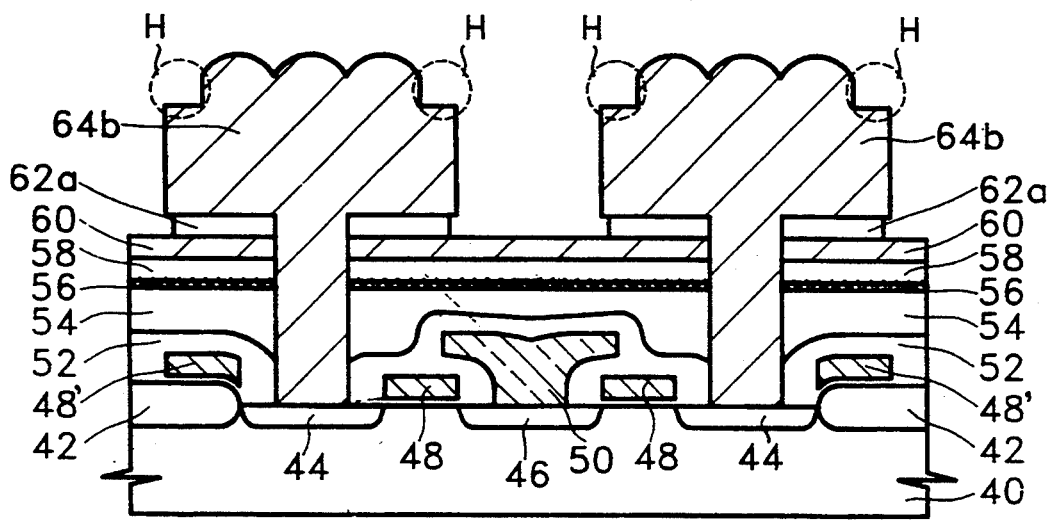

FIG. 12 shows a step of forming a first conductive pattern 64b as a conductive structure. After the step shown in FIG. 11, photoresist pattern 70 is removed and first conductive pattern 64a is etched to a depth of about 500 Å, using first material pattern 66a as an etching mask, to form an etched first conductive pattern 64b having hummocks H on the upper edges thereof (seen in FIG. 12). Subsequently, first material pattern 66a is removed. Here, an exposed portion of second spacer layer 62 is removed so that a portion of end-of-etch detection layer 60 adjacent to etched first conductive pattern 64b is exposed. Reference numeral 62a indicates the second spacer layer material which is left under first conductive pattern 64b after the exposed portion of second spacer layer 62 is partially removed. By doing so, hummocks H is are formed, and a spacer as an etching mask for forming an outer wall of an electrode is formed on the hummock during the forming of an etching mask for forming microtrenches.

Figure 13:
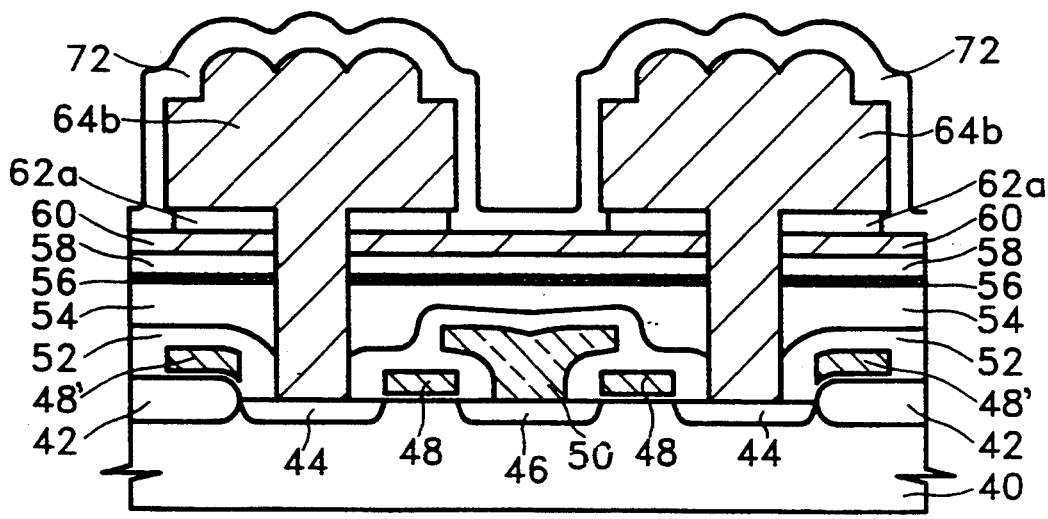

FIG. 13 shows a step of forming a second mask material layer 72. A material having a different etching rate from the material of first conductive layer 64 with respect to a predetermined etching process, (for instance, an insulating material such as HTO), is coated to a thickness of about 500 Å–1,000 Å on the resultant structure including etched first conductive pattern 64b, to form mask material layer 72. Here, the thickness of mask material layer 72 formed on etched first conductive pattern 64b is the same as that of mask material layer 72 formed on end-of-etch detection layer 60, as seen in FIG. 13.

Figure 14:
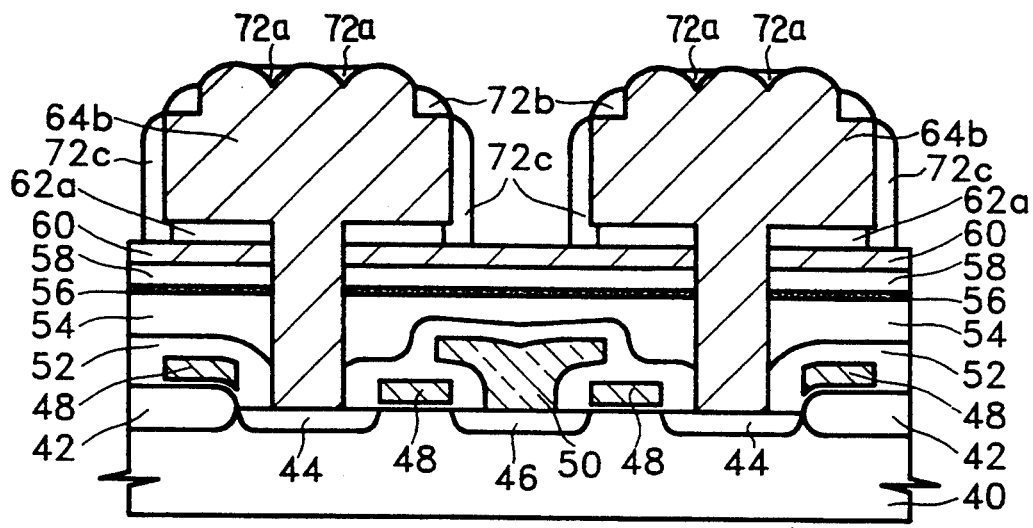

FIG. 14 shows a step of forming etching mask 72a. An etch-back step in which mask material layer 72 is an etching target and the surface of end-of-etch detection layer 60 is detected, is performed to form etching mask 72a for making microtrenches. Here, a first spacers 72b as an etching mask for forming the outer wall of the capacitor electrode are formed on hummocks H. Second spacers 72c made of the material of mask material layer 72 are formed on the outer sidewalls of the first conductive layer pattern 64b.

Here, the exposed surface area of first conductive pattern 64b after the forming of the etching mask 72a can be uniformly controlled using mask material layer 72 formed on end-of-etch detection layer 60. In other words, by uniformly adjusting the thickness of first conductive pattern 64b and mask material layer 72 on end-of-etch detection layer 60, the thickness of etching mask 72b for forming the microtrenches on first conductive pattern 64b can be uniformly controlled to be uniform after the etching of mask material layer 72.

Figure 15:
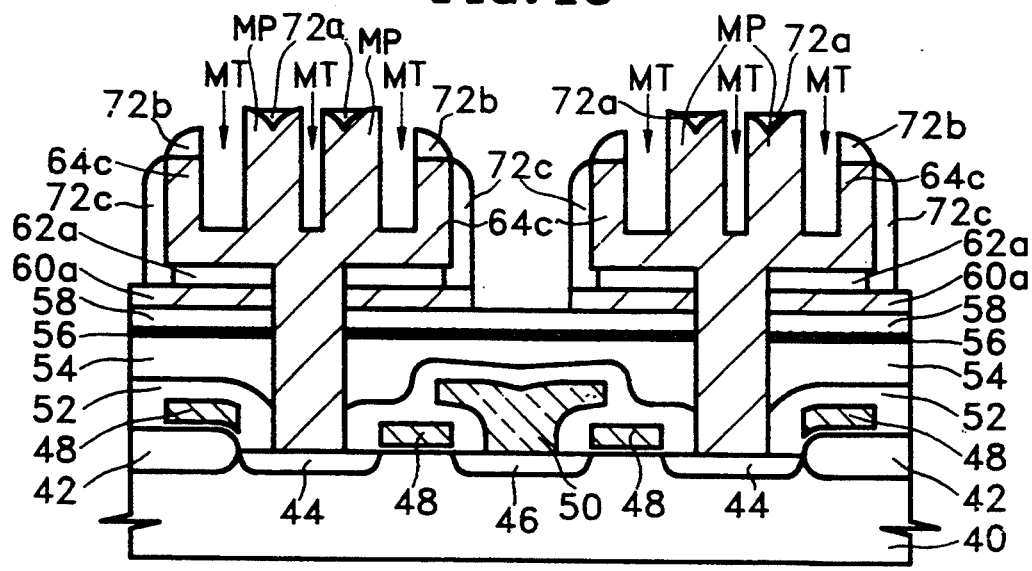

FIG. 15 shows a step of forming a main electrode 64c. Using etching mask 72a and first and second spacers 72b and 72c, anisotropic etching in which first conductive pattern 64b is the etching target is carried out to form a main electrode 64c having microtrenches MT and micropillars MP therein and an outer wall surrounding the microtrenches and micropillars.

Here, if end-of-etch detection layer 60 is made of polysilicon like the first conductive layer, then during the anisotropic etching for forming main electrode 64c, an exposed portion of end-of-etch detection layer 60 between adjacent second spacers 72c is also etched partially so that end-of-etch detection layer 60 forms a fin-structured auxiliary electrode 60a which is located under main electrode 64c, and electrically connected to column electrode 64'. This further increases the overall surface area of the storage electrode to thereby increase the capacitance. Thus, it is preferable that end-of-etch detection layer 60 is made of a conductive material.

Figure 16:
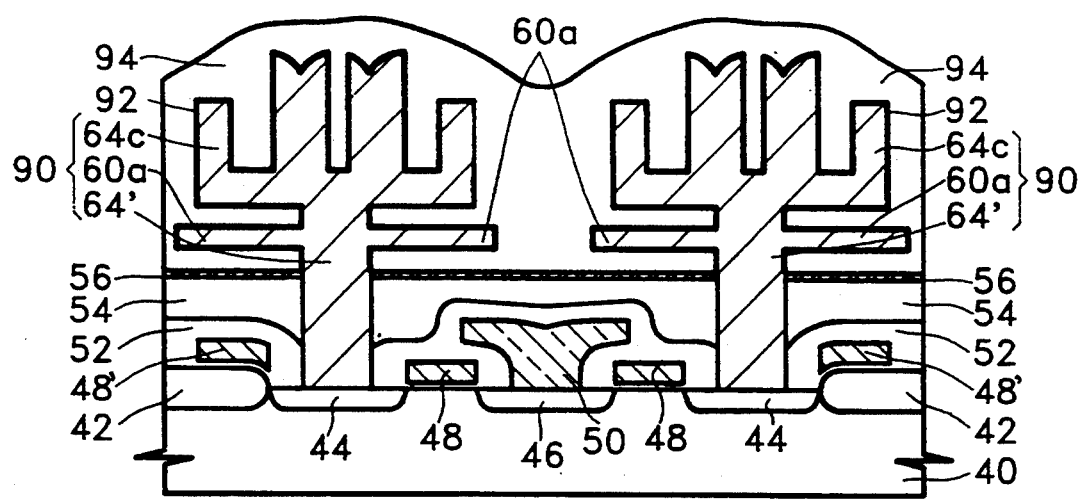

As seen in FIG. 16, this step completes a storage electrode 90 which comprises a main electrode 64c having a plurality of microtrenches MT and/or micropillars MP formed therein and an outer wall surrounding the microtrenches and/or micropillars, a column electrode 64' which supports main electrode 64c and electrically connects main electrode 64c to source region 44 of a transistor, and a fin-structured auxiliary electrode 60a formed under main electrode 64c and electrically connected to column electrode 64'. The column electrode 64' passes through a center portion of auxiliary electrode 60a. Since auxiliary electrode 60a is formed by etching end-of-etch detection layer 60 using second spacer 72c as an etching mask, it is wider than main electrode 64c as represented in FIG. 16.

The outer wall surrounding the microtrenches and/or micropillars is formed under first spacer 72b formed on hummock H. Thus, the top of the outer wall is lower than the top of micropillars.

FIG. 16 shows a step of forming a dielectric layer 92 and plate electrode 94. After the step of FIG. 15, etching mask 72a and first and second spacers 72b and 72c are removed. At this time, first spacer layer 58 formed on etch-blocking layer 56 is also removed. Next, a dielectric material is coated on the overall surface of storage electrode 90 to form dielectric layer 92. A conductive material such as polysilicon doped with impurity is deposited on the overall surface of the resultant structure to form a second conductive layer, which is subsequently patterned to thereby form plate electrode 94. This is the completion of the capacitor of the present invention.

Though, in this embodiment the manufacturing process is carried out after separately forming an end-of-etch detection layer 60 on a first spacer layer 58, etch-blocking layer 56 formed on the planarization layer 54 may be instead used as the end-of-etch detection layer without forming a separate layer for end-of-etch detection.

Embodiment 2

FIGS. 17-22 are cross-sectional views for explaining a second embodiment of the method for manufacturing a semiconductor memory device of the present invention.

This embodiment is a method for increasing cell capacitance by forming an HSG polysilicon pattern having fine hemispherical grains on an outer sidewall of the outer wall of the main electrode in the first embodiment.

Figure 17:
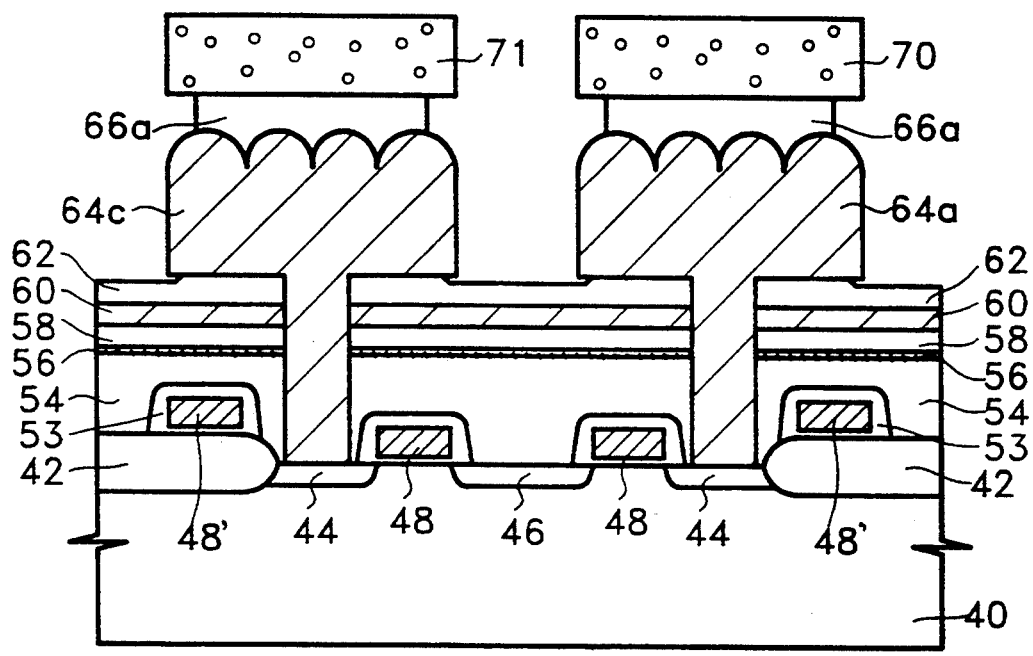
FIGS. 17–22 are cross-sectional views for explaining the second embodiment of the method for manufacturing a semiconductor memory device of the present invention.

FIG. 17 shows a step of forming a first material layer pattern 66a for forming first conductive pattern 64a and accompanying hummocks. Particularly, as described in Embodiment 1, a field oxide layer 42 is formed on a semiconductor substrate 40 to define semiconductor substrate 40 into active regions and isolation regions. A transistor comprising a source region 44, drain region 46 and gate electrode 48 is formed on each active region. An insulating layer 53 for insulating a gate electrode 48 is formed on the overall resultant structure. An insulating material layer having a reflow characteristic, such as BPSG, is deposited, reflowed by heat treatment, and planarized to form a planarization layer 54 having the planar surface. Next, in the same method as in Embodiment 1, silicon nitride is coated to a thickness of about 300 Å–500 Å to form etch-blocking layer 56. HTO is then coated to a thickness of about 500 Å–1,000 Å to form a first spacer layer 58. Polysilicon doped with an impurity is then coated to a thickness of about 500 Å–1,000 Å to form end-of-etch detection layer 60. An insulating material such as HTO is coated to a thickness of about 500 Å–1,000 Å to form second spacer layer 62. A portion of the materials stacked on source region 44 are removed to form a contact hole for the storage electrode to the source region 44. Next, polysilicon is deposited to a thickness of about 2,000 Å–5,000 Å on the resultant structure and impurity is doped to form a first conductive layer (not shown) having an uneven surface with a plurality of valleys.

Sequentially, an insulating material (such as HTO) is coated to a thickness of about 500 Å to form a first material layer (not shown) on the first conductive layer. Thereafter, via a conventional method, a photoresist pattern 70 which is defined into an individual cell unit, is formed on the first material layer. Anisotropic etching is carried out using photoresist pattern 70 as an etching mask and the surface of second spacer layer 62 as the end-of-etch point, to sequentially etch the first material layer and first conductive layer so as to form a first material layer pattern (not shown) and first conductive pattern 64a which are defined into an individual cell units. Next, using an oxide etching solution such as a BOE or HF solution diluted at a ratio of 100:1, the first material layer pattern which has the same size as photoresist pattern 70 by being etched in the above step is partially etched further, to form an interim material pattern 66a for making hummocks. Here, though not described in the first embodiment, since the first material layer is made of the same material as that of second spacer layer 62, during the etching to form interim material layer pattern 66a, the surface of second spacer layer 62 exposed between first conductive pattern 64a is also partially etched as seen in FIG. 17.

Figure 18:
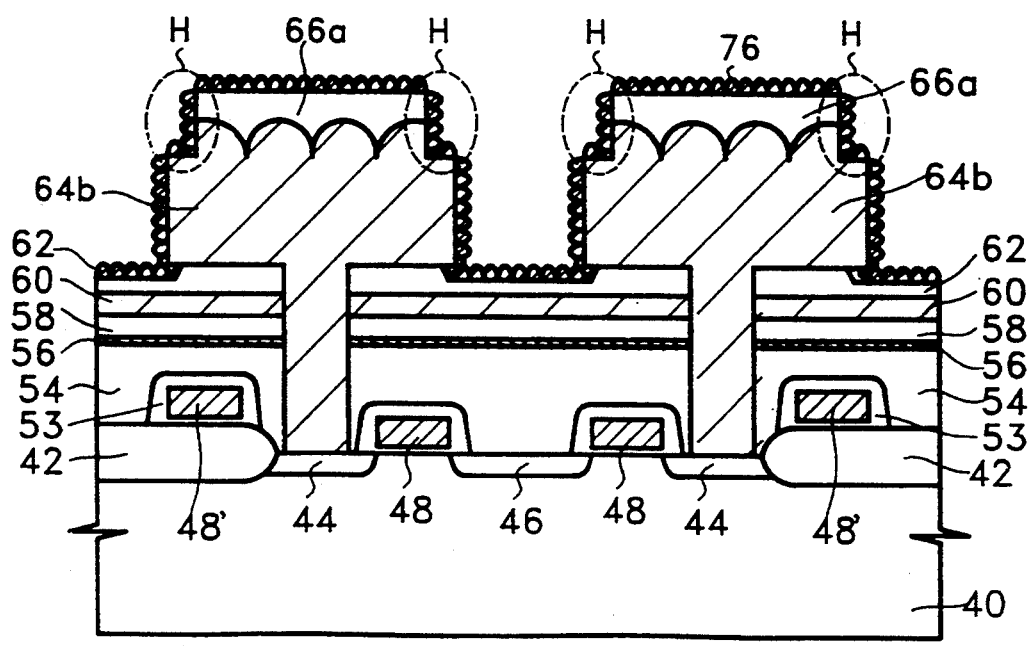

FIG. 18 shows a step of forming a conductive pattern 64b as a conductive structure and an HSG polysilicon layer 76 composed of fine hemispherical grains. After the step shown in FIG. 17, photoresist pattern 70 is removed and first conductive pattern 64a is etched to a depth of about 500 Å, using first material layer pattern 66a as an etching mask, so as to form a first conductive pattern 64b having hummocks H on the upper edges thereof, which is a conductive structure having an uneven surface with a plurality of valleys and is defined into an individual cell unit. In the same method as in forming the first conductive layer, polysilicon layer 76 with fine hemispherical grains (smaller than those of the first conductive layer) having a size of about 100 Å–500 Å (hereinafter referred to as a "fine-HSG polysilicon layer") is formed on the overall surface of the resultant structure. An impurity is then implanted thereinto.

Figure 19:
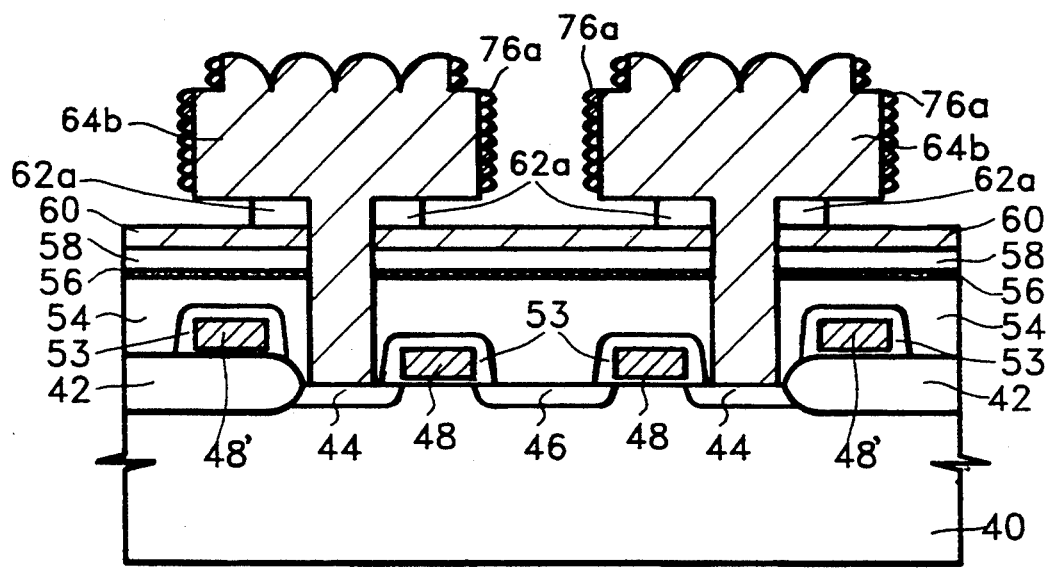

FIG. 19 shows a step of etching back fine-HSG polysilicon layer 76. Fine-HSG polysilicon layer 76 is etched back to leave the fine hemispherical grains only on the sidewalls of conductive pattern 64b. Then, material layer pattern 66a is removed. The exposed surface of second spacer layer 62 is also partially removed further, so that a portion of end-of-etch detection layer 60 between adjacent conductive patterns 64b is exposed. The residual 62a of first spacer layer 62 is formed under first conductive pattern 64b. Reference numeral 76a represents the fine-HSG polysilicon pattern formed on the sidewalls of conductive pattern 64b after etchback.

Figure 20:
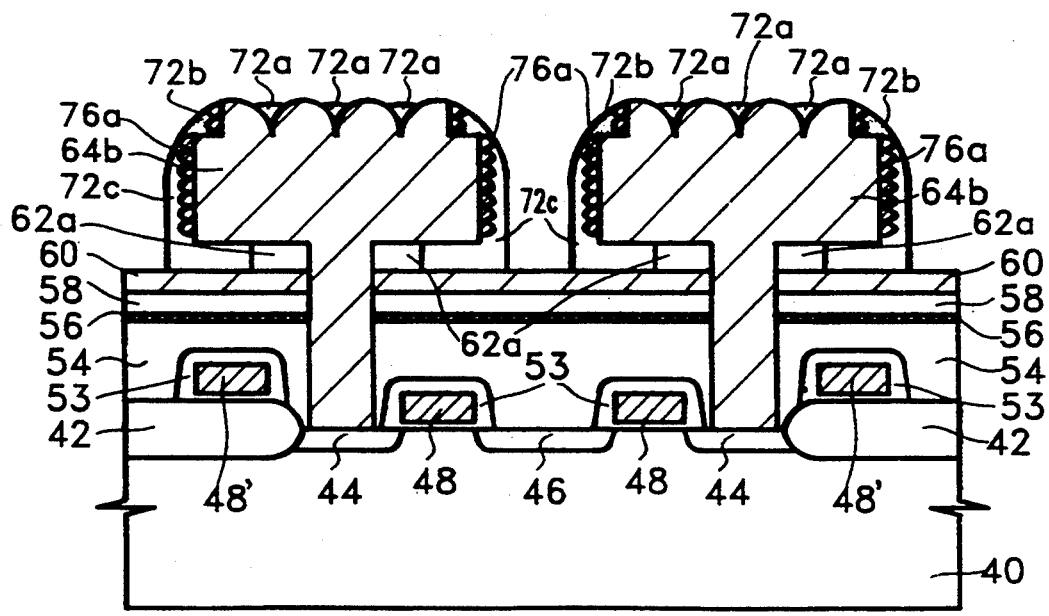

FIG. 20 shows a step of forming an etching mask 72a. As shown in the first embodiment, a mask material such as HTO is coated to a thickness of about 500 Å–1,000 Å on the overall resultant structure including conductive layer pattern 64b, to thereby form a mask material layer. An etch-back step, in which the mask material layer is an etching target and the surface of end-of-etch detection layer 60 is the etching end-point, is performed to form etching mask 72a for making microtrenches in the valleys. Here, as shown in the first embodiment, first spacers 72b for forming the cylindrical outer sidewall are formed on hummocks H, and second spacers 72c made of the same material as the mask material layer are formed on the sidewalls of the conductive pattern 64b.

Figure 21:
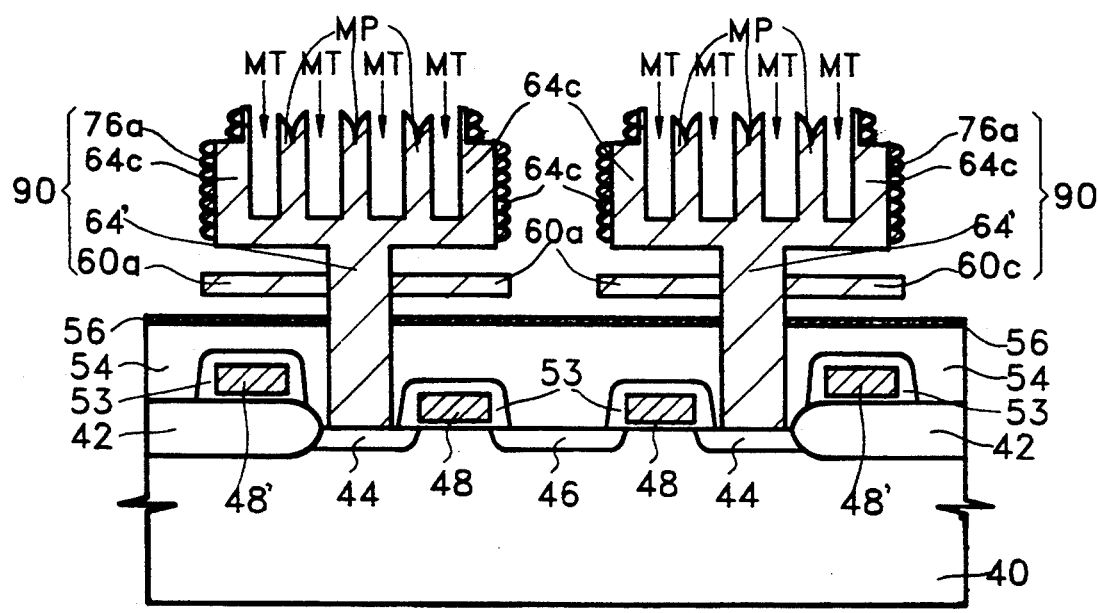

FIG. 21 shows a step of forming a storage electrode 90. Using etching masks 72a and first and second spacers 72b and 72c, anisotropic etching in which conductive pattern 64b is the etching target is carried out to form a main electrode 64c having microtrenches MT and/or micropillars MP and an outer wall surrounding the microtrenches and/or micropillars. Since the end-of-etch detection layer 60 is made of polysilicon, during the anisotropic etching for forming main electrode 64c, the portion of end-of-etch detection layer 60 exposed between adjacent spacers 72c is also etched partially so that end-of-etch detection layer 60 forms a fin-structured auxiliary electrode 60a which is located under main electrode 64c and electrically connected to the storage electrode 90. Then, etching masks 72a and 72b and spacer 72c are removed. Here, first spacer layer 58 formed on etch-blocking layer 56 is also removed.

This step completes a storage electrode 90 which comprises a main electrode 64c having a plurality of microtrenches and/or micropillars, an outer wall surrounding the microtrenches and/or micropillars, an HSG polysilicon pattern 76a formed on an outer sidewall of the outer wall, a column electrode 64' which supports main electrode 64c and electrically connects main electrode 64c to source region 44 of a transistor, and a fin-structured auxiliary electrode 60a formed under main electrode 64c and electrically connected to column electrode 64'. The column electrode 64' passes through a center portion of auxiliary electrode 60a. Also, since auxiliary electrode 60a is formed by etching the end-of-etch detection layer using second spacer 72c as an etching mask, it is somewhat wider than main electrode 64c.

Figure 22:
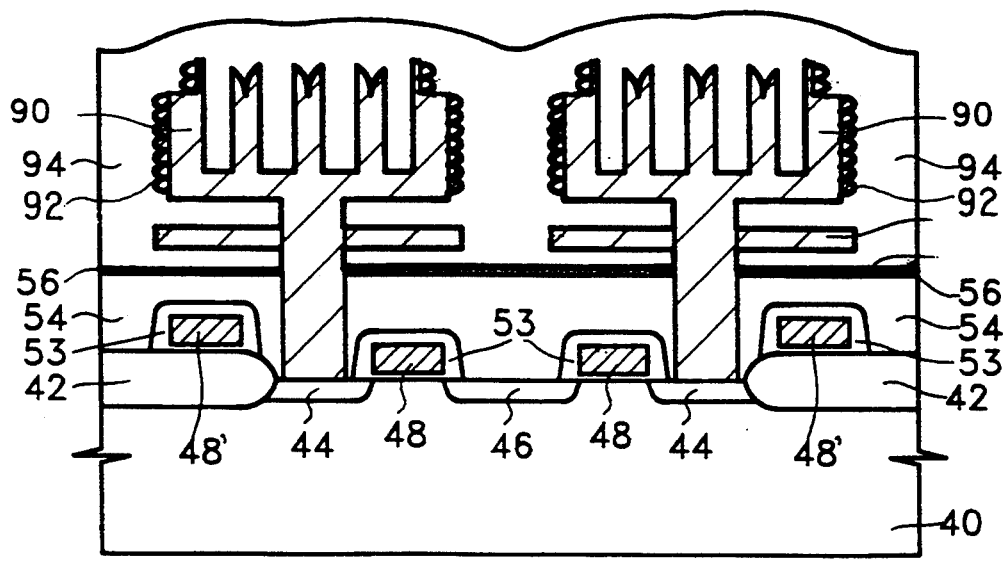

FIG. 22 shows a step of forming a dielectric layer 92 and plate electrode 94. After the step of FIG. 21, a dielectric material is coated on the overall surface of auxiliary electrode 60a and storage electrode 90 to form dielectric layer 92. A conductive material such as polysilicon doped with an impurity is deposited on the overall surface of the resultant structure to form a second conductive layer, which is subsequently patterned to form plate electrode 94. This is the completion of the capacitor according to the second embodiment of the present invention.

Embodiment 3

In the step shown in FIG. 17 of the second embodiment, part of the exposed surface of the second spacer layer 62 is removed to form a void under a bottom periphery of the conductive pattern 64a. In such a case, if the fine-HSG polysilicon layer 76 having the fine hemispherical grains is formed in FIG. 18, the polysilicon layer fills the void. Subsequently, the above granular polysilicon layer 76 is etched back and the first conductive material pattern (reference numeral 66a in FIG. 18) for forming hummocks is removed, to thus remove more of the second layer 62 while leaving a residue 62a thereof. Here, the HSG polysilicon material filling the void is left on the lower edge of the conductive pattern 64b, to thereby form a hem made of the HSG polysilicon, which is referred to as an HSG polysilicon tail.

Figure 23:
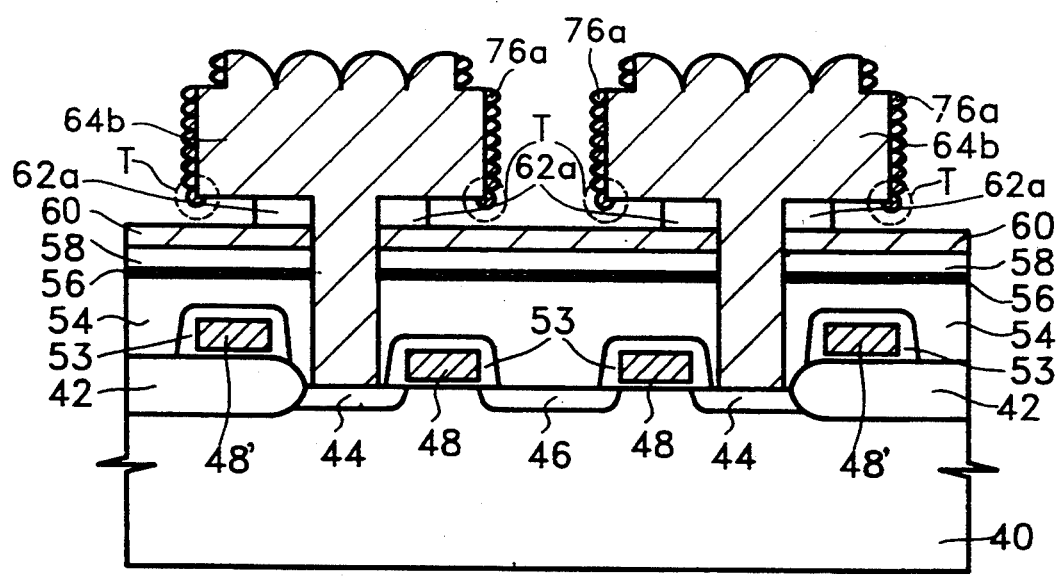
FIG. 23 is a cross-sectional view which shows hemispherical polysilicon tails formed by the hemispherical polysilicon layer of the second embodiment.

FIG. 23 is a cross-sectional view for showing the formation of an HSG polysilicon tails T made by the fine-HSG polysilicon layer shown in Embodiment 2. In the case in which the HSG polysilicon tail T is formed when the polysilicon is deposited to form a second conductive layer during a subsequent step, a void is created in the second polysilicon layer which lowers the reliability of the capacitor. In this third embodiment, in order to prevent the forming of the HSG tail T, the hummock of the first conductive pattern is formed by etching using a spacer instead of using the first material layer pattern which is smaller than the first conductive layer pattern in Embodiment 2.

FIGS. 24–30 are cross-sectional views for explaining the third embodiment of the method for manufacturing a semiconductor memory device of the present invention.

Figure 24:
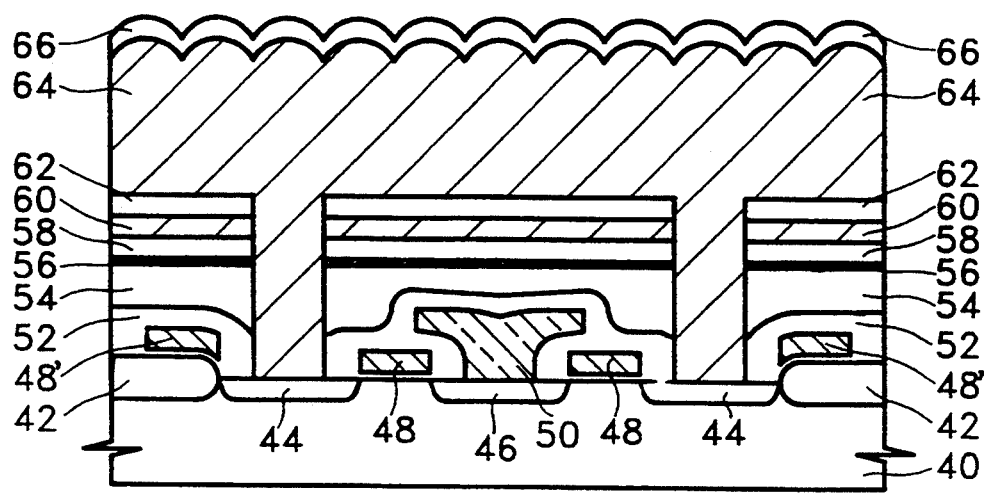
FIGS. 24–30 are cross-sectional views for explaining the third embodiment of the method for manufacturing a semiconductor memory device of the present invention.

FIG. 24 shows a step of forming first conductive layer 64 having an uneven upper surface with a plurality of valleys and first material layer 66 thereon. In FIG. 24, the same reference numerals represent like elements as those in Embodiments 1 and 2. In this embodiment, first conductive layer 64 comprised of polysilicon doped with impurity and first material layer 66 comprised of HTO are formed in the same manner as in Embodiments 1 and 2 except that a step of forming bit line 50 is added after gate electrode 48 and gate insulating layer 52 are formed, and before planarization layer 54 is formed.

Figure 25:
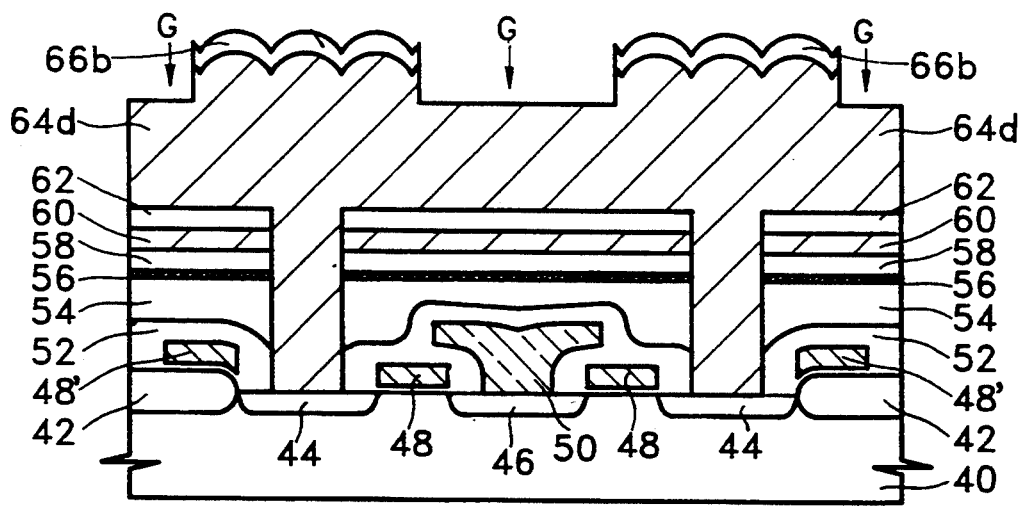

FIG. 25 shows a step of forming a first material pattern 66b and a first etching of first conductive layer 64. Specifically, a photoresist is coated on first material layer 66 to form a photoresist film (not shown) which is then exposed and developed in a conventional method to form a photoresist pattern (not shown) defining individual cell units. Using the photoresist pattern as an etching mask, first material layer 66 is etched to form first material pattern 66b. First conductive layer 64 is partially etched to a depth of about 500 Å so as to obtain a first conductive pattern 64d in which, as shown in FIG. 25, grooves G are formed between adjacent cell borders. The photoresist pattern is then stripped away.

Figure 26:
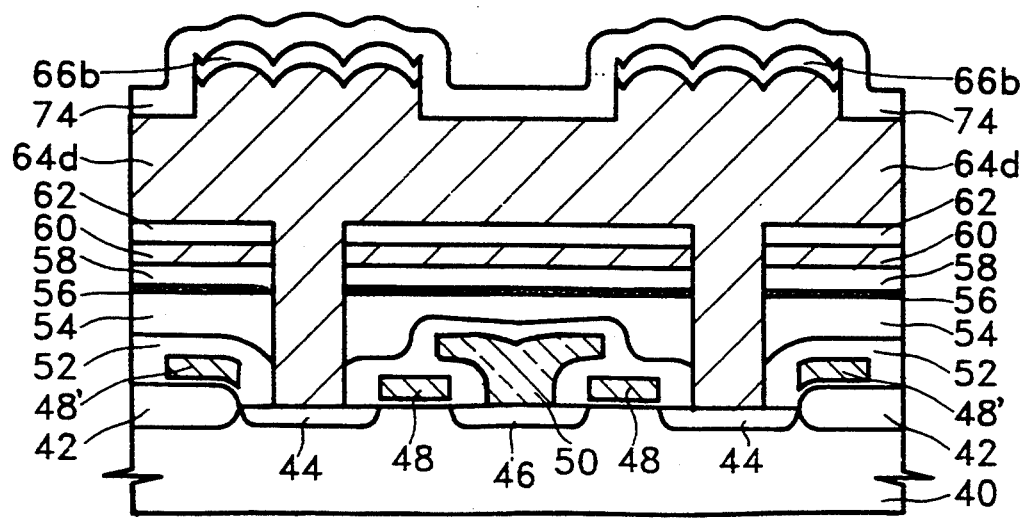

FIG. 26 shows a step of forming a third material layer 74. A third material having a different etching rate from the material of the first conductive layer 64 with respect to a predetermined etching process, (for instance, an oxide such as HTO), is coated as thick as is desired (usually, 500 Å–1,500 Å) on the surface of the resultant structure having first conductive pattern 64d having grooves G and first material layer pattern 66b formed thereon, to thereby form third material layer 74.

Figure 27:
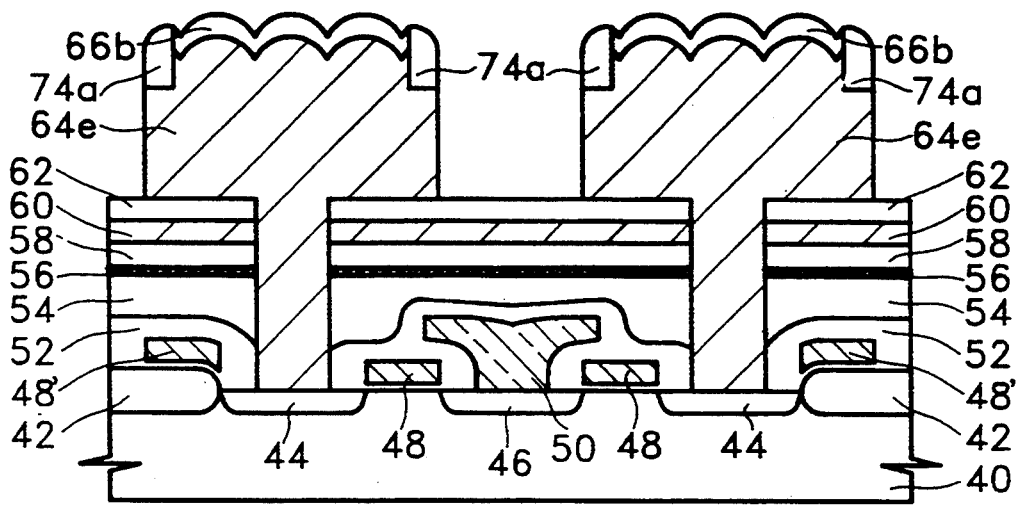

FIG. 27 shows a step of forming spacer 74a on peripheral sidewalls of grooves G of first conductive pattern 64d and dividing first conductive layer pattern 64d to form a conductive layer pattern 64e defined into individual cell units. Particularly, using third material layer 74 as the etching target, an anisotropic etching is carried out to form to form spacers 74a made of the third material on the sidewall of grooves G of first conductive pattern 64d. Using first material pattern 66b and spacers 74a as an etching mask and conductive pattern 64d as the etching target, an anisotropic etching is performed to form conductive pattern 64e as a conductive structure which is defined into individual cell units and has hummock on an upper portion thereof and an uneven surface with a plurality of valleys. Here, since conductive pattern 64d is etched using spacer 74a until the surface of second spacer layer 62 is exposed, the voids of Embodiment 2 are not created under conductive pattern 64e after etching.

Figure 28:
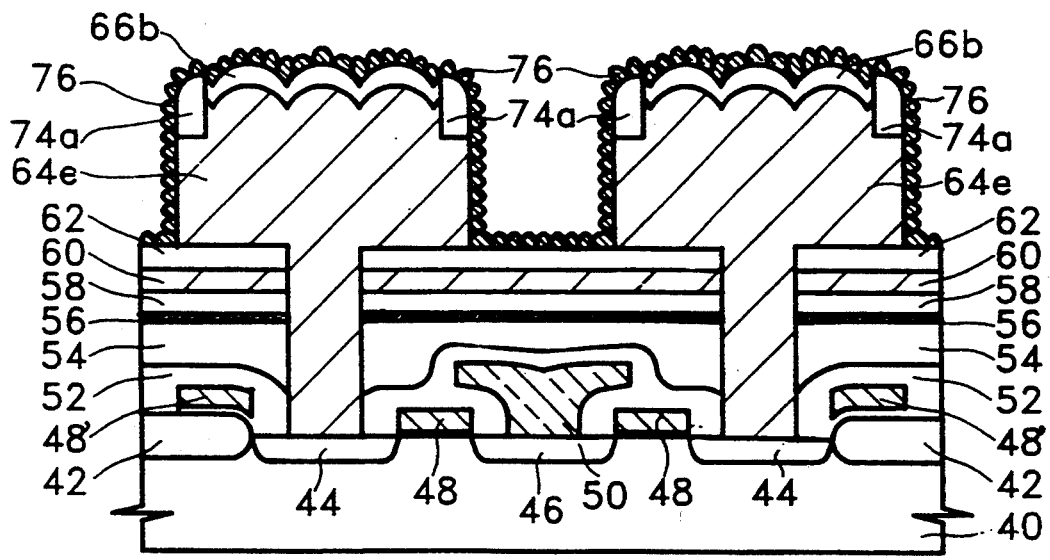

FIG. 28 shows a step of forming an HSG polysilicon layer 76 having fine hemispherical grains. In the same method as in the second embodiment, fine-HSG polysilicon layer 76 doped with an impurity and having a grain size of about 100 Å–500 Å is formed on the whole surface of the resultant obtained in FIG. 27.

Figure 29:
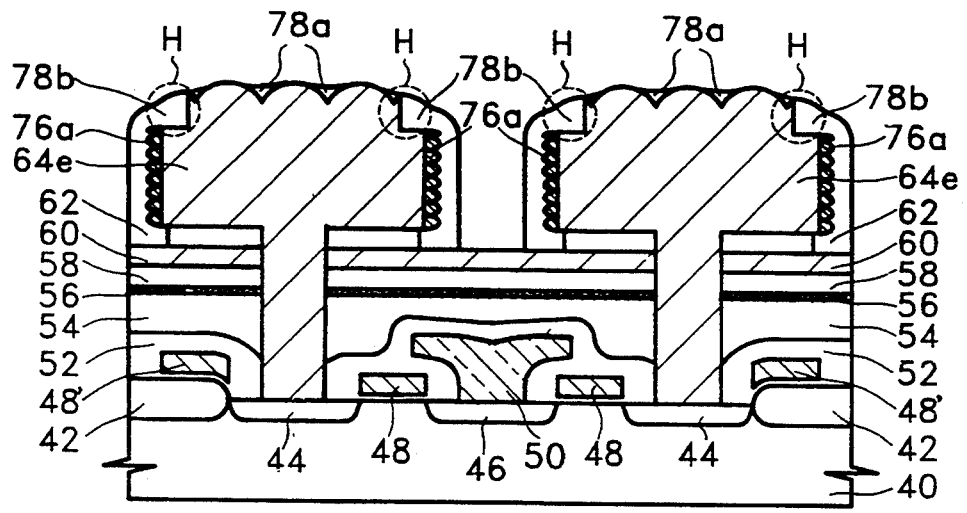

FIG. 29 shows steps of etching back HSG polysilicon layer 76 and forming etching mask 78a for forming microtrenches and micropillars. Particularly, fine-HSG polysilicon layer 76 obtained in FIG. 28 is etched back to leave a fine-HSG polysilicon pattern 76a only on peripheral sidewalls of conductive pattern 64e, then first material pattern 66b and spacers 74a are removed. This leaves conductive pattern 64e which has hummocks H and sidewalls on which fine-HSG polysilicon pattern 76a is formed. Here, the second spacer layer exposed between adjacent cells of conductive pattern 64e is also removed to form residual 62d of the second spacer layer under conductive pattern 64e.

Next, a material having a different etching rate from the material of the first conductive layer 64 with respect to a predetermined etching process, (for instance, an oxide such as HTO), is coated to a thickness of about 500 Å–1,000 Å on the surface of the resultant structure to form a mask material layer (not shown) which is then etched back until the tops of the grains of conductive pattern 64e are partially exposed, thus forming etching mask 78a in the valleys of conductive pattern 64e. Here, spacer 78b made of the material of the mask layer is formed along the hummocks and the sidewalls of conductive layer pattern 64e. The etch-back is performed using end-of-etch detection layer 60.

Figure 30:
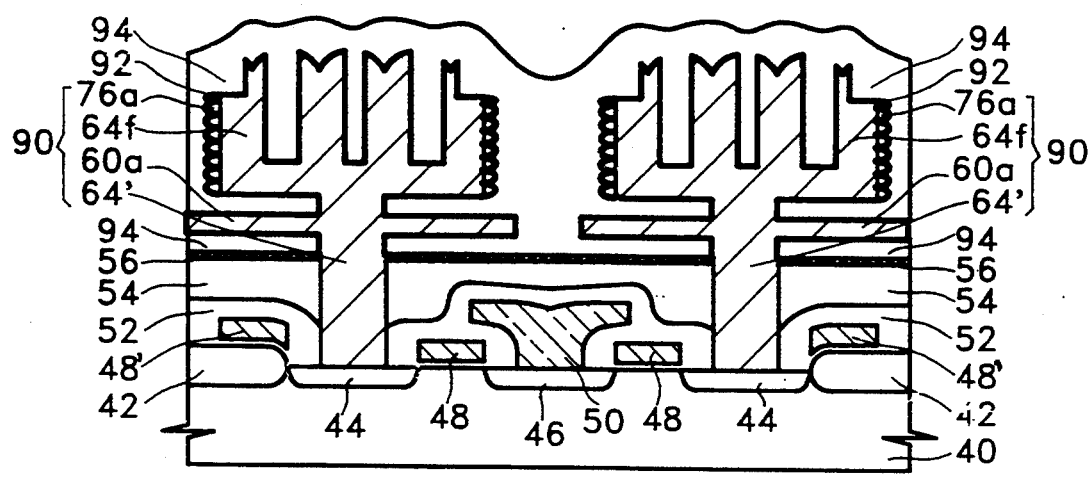

FIG. 30 shows a step of forming storage electrode 90, dielectric layer 92 and plate electrode 94 to complete the capacitor. Particularly, using etching mask 78a and spacers 78b. Conductive pattern 64e, whose upper surface is exposed, is etched to a predetermined depth, using mask 78a, to form a storage electrode 90 comprising a main electrode 64f having microtrenches MT and micropillars MP formed therein, surrounded by a cylindrical outer wall surrounding the microtrenches and micropillars, and a fine-HSG polysilicon pattern 76a formed on an outer side wall of the outer wall. Here, when end-of-etch detection layer 60 is formed of polysilicon, it is also etched during the etching of conductive pattern 64e and becomes a fin-structured auxiliary electrode 60a electrically connected with main electrode 64f.

This step completes a storage electrode 90 which comprises a main electrode 64f having a plurality of microtrenches and micropillars formed therein, an outer wall surrounding the microtrenches and micropillars, a fine-HSG polysilicon pattern 76a formed on an outer sidewall of the outer wall, a column electrode 64' which supports main electrode 64f and electrically connects main electrode 64f to source region 44 of a transistor, and a fin-structured auxiliary electrode 60a formed under main electrode 64f and electrically connected to column electrode 64'. The column electrode 64' typically passes through a center portion of auxiliary electrode 60a. Also, since auxiliary electrode 60a is formed by etching the end-of-etch detection layer using second spacer 72c as an etching mask, it is wider than main electrode 64f.

Then, etching mask 78a and spacers 78b are removed. Here, the remaining residual 62a of the second spacer layer is also removed with the first spacer layer. A dielectric material is coated on the surface of storage electrode 90 to form dielectric layer 92, and a conductive material such as polysilicon doped with impurity is deposited to form a second conductive layer, which is subsequently patterned to form plate electrode 94 to complete a capacitor.

In the aforementioned Chin et al. method, after forming a mask material layer, etching is performed in order to form an etching mask for microtrenches and micropillars by timed etching in which the etching is carried out for a predetermined time. However, a uniformly thick etching mask is very difficult to create in this manner. Accordingly, the shape of the storage electrodes thus obtained are irregular, resulting in non-uniform cell capacitance. However, according to the method of the present invention, by using an end-of-etch detection layer, an etching mask having a uniform thickness for forming microtrenches and micropillars can be formed in the valleys of an uneven conductive pattern surface. This allows a regular shape for the storage electrodes to thereby obtain uniform cell capacitance.

Further, when a conductive material is used for the end-of-etch detection layer, an auxiliary electrode maybe is formed under the cylindrical main electrode. Forming such an auxiliary electrode greatly increases the cell capacitance of the present invention over that obtained by the use of the storage electrode disclosed by Chin et al.

According to Embodiments 2 and 3, since the polysilicon pattern having fine hemispherical grains are formed on the outerside wall of the cylindrical outer wall of the main electrode, cell capacitance is increased by the uneven surface because the effective surface area increases.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A method for manufacturing a capacitor of a semiconductor memory device comprising the steps of:
   (a) forming an end-of-etch detection layer on a semiconductor substrate;
   (b) forming a conductive structure having an uneven uppermost surface including a plurality of valleys, said conductive structure defining a plurality of individual cell units on said end-of-etch detection layer, each said cell unit of said conductive structure having an adjacent exposed portion of said end-of-etch detection layer, wherein said conductive structure has a hummock adjacent an upper peripheral edge of each said cell unit;
   (c) depositing a mask material layer on said conductive structure and on said exposed portions of said end-of-etch detection layer;
   (d) etching backs said mask material layer by detecting an end-point of the etching using said end-of-etch detection layer thereby forming an etching mask deposited in said valleys of said conductive structure; and
   (e) partially etching said conductive structure using said etching ask to form a main electrode of a capacitor having microtrenches and micropillars.

2. A method for manufacturing a semiconductor memory device according to claim 1, further comprising the steps of:
   (a) forming a first spacer layer on said semiconductor substrate prior to the step of forming said end-of-etch detection layer; and
   (b) forming a second spacer layer on said end-of-etch detection layer prior to the step of forming said conductive structure.

3. A method for manufacturing a semiconductor memory device according to claim 2, wherein said end-of-etch detection layer is comprised of a conductive material.

4. A method for manufacturing a semiconductor memory device according to claim 3, wherein said end-of-etch detection layer and said conductive structure are comprised of the same conductive material so that during the step of etching said conductive structure, said end-of-etch detection layer is etched to form an auxiliary electrode underneath said main electrode.

5. A method for manufacturing a semiconductor memory device according to claim 2, wherein said end-of-etch detection layer is comprised of an insulating material having a different etching rate from that of the material of said second spacer layer and that of said mask material layer.

6. A method for manufacturing a semiconductor memory device according to claim 5, wherein said end-of-etch detection layer is comprised of nitride silicon.

7. A method for manufacturing a semiconductor memory device according to claim 1, said method further comprising the steps of:
  (a) forming an granular polysilicon layer on the surface of the structure obtained after the step of forming said conductive structure; and
  (b) etching back said granular polysilicon layer to form granular polysilicon pattern on an outer peripheral sidewall of said individual cell units of said conductive structure.

8. A method for manufacturing a capacitor of a semiconductor device, comprising the steps of:
  (a) sequentially forming an end-of-etch detection layer on a semiconductor substrate and a second spacer layer on said end-of-etch layer;
  (b) forming a first conductive layer with an upper surface having a plurality of topographical valleys thereon on said second spacer layer;
  (c) forming a first material layer on said first conductive layer;
  (d) forming a photoresist pattern on said first material layer for defining individual cell units;
  (e) anisotropically etching said first material layer and first conductive layer using said photoresist pattern to form a first etched material pattern and a first etched conductive pattern;
  (f) isotopically etching said first etched material pattern, thereby forming a second material etched pattern which is smaller than said first etched material pattern;
  (g) removing said photoresist pattern;
  (h) partially etching an upper edge portion of said first etched conductive pattern using said second etched material pattern as an etching mask, thereby forming a second etched conductive pattern having a hummock adjacent an upper peripheral edge thereof;
  (i) removing second etched material pattern and a portion of said second spacer layer;
  (j) forming a mask layer on the surface of the resultant structure after step (i);
  (k) etching back said mask layer by detecting an endpoint of etching using said end-of-etch detection layer to form an etching mask deposited in said valleys and a spacer formed on said hummock; and
  (l) anisotropically and partially etching said second etched conductive pattern using said etching mask and said spacer, thereby forming a main electrode of capacitor having a plurality of microtrenches and micropillars therein.

9. A method for manufacturing a capacitor of a semiconductor device comprising the steps of:
  (a) sequentially forming a first conductive layer on a semiconductor substrate and forming a first material layer on said first conductive layer;
  (b) patterning said first material layer to form a first material pattern for defining said first conductive layer into individual cell units;
  (c) partially etching said first conductive layer using first material pattern as an etching mask, to thereby form a first conductive pattern having grooves between adjacent individual cell units, said grooves defining sidewall portions of said cell units;
  (d) forming spacers on said sidewall portions; and
  (e) etching said first conductive pattern using said spacers and said first material pattern as an etching mask to form a first conductive pattern having a hummock on an upper edge therearound.

10. A method for manufacturing a capacitor of a semiconductor memory device according to claim 9, wherein said first conductive pattern has a rough upper surface having a plurality of valleys thereon.

11. A method for manufacturing a capacitor of a semiconductor memory device, according to claim 10, further comprising the steps of:
  (a) forming a granular polysilicon layer covering the structure obtained after forming said first conductive pattern in step (e); and
  (b) etching back said granular polysilicon layer to leave said granular polysilicon layer only on sidewalls of each said individual cell unit of said first conductive pattern.

12. A method for manufacturing a capacitor of a semiconductor memory device according to claim 10, further comprising the steps of:
  (a) removing said spacers and said first material pattern after the step of etching said first conductive pattern;
  (b) depositing a mask material layer on the surface of the resultant structure;
  (c) etching back said mask material layer to form an etching mask in said valleys of said conductive pattern; and
  (d) partially etching said first conductive pattern using said etching mask to form a main electrode of a capacitor having microtrenches and micropillars therein.

13. A method for manufacturing a semiconductor device comprising the steps of:
  (a) sequentially stacking a first spacer layer, an end-of-etch detection layer, a second spacer layer, a first conductive layer, and a first material layer on a semiconductor substrate, said first conductive layer having an uneven upper surface having a plurality of valleys;
  (b) patterning said first material layer to form a first material mask pattern for defining individual cell units;
  (c) partially etching said first conductive layer using said first material mask pattern as an etching mask, thereby forming a first conductive pattern having grooves between adjacent individual cell units;
  (d) forming spacers on sidewalls of said cell units;
  (e) etching said first conductive pattern using said spacers and said first material mask pattern as an etching mask to form an etched first conductive pattern defined into individual cell units, each unit having a hummock formed on an upper edge therearound (f) forming a granular polysilicon layer covering the resultant structure obtained after forming said etched first conductive pattern;

(g) etching back said granular polysilicon layer to leave a granular polysilicon pattern on a peripheral sidewall of each said cell unit of said first conductive pattern;

(h) removing said spacers and said first material pattern;

(i) depositing a mask material layer on the surface of the resultant structure after step (h);

(j) etching back said mask material layer to form an etching mask in said valleys of said conductive pattern; and (k) partially etching said first conductive pattern using said etching mask of step (j) to form a main electrode of a capacitor having microtrenches and micropillars.

* * * * *